United States Patent [19]
Nagano et al.

[11] Patent Number: 5,453,328
[45] Date of Patent: Sep. 26, 1995

[54] ELECTROMAGNETIC WAVE REFLECTION-PREVENTING MATERIAL AND ELECTROMAGNETIC WAVE REFLECTION-PREVENTING METHOD

[75] Inventors: Toshiaki Nagano; Hideo Kogure; Naozumi Iwasawa; Tetsu Maki, all of Hiratsuka, Japan

[73] Assignee: Kansai Paint Co., Ltd., Amagasaki, Japan

[21] Appl. No.: 183,763

[22] Filed: Jan. 21, 1994

[30] Foreign Application Priority Data

Jan. 22, 1993 [JP] Japan ................................ 5-027354
Feb. 17, 1993 [JP] Japan ................................ 5-053102
Feb. 25, 1993 [JP] Japan ................................ 5-063018

[51] Int. Cl.⁶ ........................................ B32B 9/00
[52] U.S. Cl. ................... 428/545; 428/546; 428/549; 174/35 C; 174/35 R; 174/35 MS
[58] Field of Search ........................ 428/545, 546, 428/549; 174/35 C, 35 R, 35 MS

[56] References Cited

FOREIGN PATENT DOCUMENTS 241098 9/1990 Japan .

Primary Examiner—Patrick J. Ryan
Assistant Examiner—Cathy Lee
Attorney, Agent, or Firm—Fisher, Christen & Sabol

[57] ABSTRACT

An electromagnetic wave reflection-preventing material having a structure formed by a process which comprises successively laminating (A) a pattern layer formed in the form of a geometrical pattern having a volume resistivity of $10^3$ $\Omega$ . cm or less, if needed, (B) a supporting layer, (C) a resin layer, and, if needed, (D) a supporting layer, to form a laminate unit, laminating a pluralitry of the laminate unit so that the layer (A) may face on the layer (C) or (D) to form a multiple laminate unit structure, and laminating the multiple laminate unit structure onto (E) an electromagnetic wave reflecting material layer so that the layer (C) or (D) of the multiple laminate unit structure may face on the layer (E), preferably further laminating a clear or colored coating layer onto the uppermost metallic pattern layer of the electromagnetic wave, reflection-preventing material; and an electromagnetic wave reflection-preventing method which comprises applying the electromagnetic wave reflection-preventing material onto a structure, or which comprises applying the multiple laminate unit structure obtained by removing the electromagnetic wave reflecting material layer (E) from the electromagnetic wave reflection-preventing material onto an electromagnetic wave reflecting structure having a metallic surface.

13 Claims, 5 Drawing Sheets

ELECTROMAGNETIC WAVE REFLECTION-PREVENTING MATERIAL AND ELECTROMAGNETIC WAVE REFLECTION-PREVENTING METHOD

BACKGROUND OF THE INVENTION (1) Field of the Invention

This invention relates to an electromagnetic wave reflection-preventing material and electromagnetic wave reflection-preventing method which make it possible to prevent interference due to electromagnetic wave and to be of a thin-gage film and weight-saved.

(2) Description of the Prior Art

For the purpose of avoiding a malfunction of an electronic equipment by an electromagnetic wave, there have been proposed in the art a process which comprises coating an electrically-conduction coating composition onto a housing of the electronic equipment, an process which comprises forming a thin film of a metal such as zinc, aluminium, iron and copper by plating, cladding, deposition, etc. onto a plastic substrate, and so forth. However, the above process coating the electrically-conductive coating composition onto the housing has such disadvantages that an electromagnetic wave shielding effect is poor and that the effect may be reduced with time. On the other hand, according to the above process forming the thin metal film onto the plastic substrate, the electromagnetic wave is reflected in such a large amounts that a secondary electromagnetic wave interference problem may be raised.

Japanese Patent Application Laid-open No. 241098/90 discloses an electromagnetic wave-shielding film formed by drawing a geometrical pattern onto a film by use of an electrically-conductive metal, and shows that the electromagnetic wave-shielding film has good shielding properties. The above films proposed in the art may effectively function as a shielding material for preventing a leakage of the electromagnetic wave generated from the electronic equipment, or preventing a malfunction of the electronic equipment due to the electromagnetic wave from outside, but may not effectively function for preventing an electromagnetic wave interference such as a false image of a radar due to a reflection of the electromagnetic wave, for example, by a bridge, a building, etc., or the like.

For the purpose of preventing the above interferences due to the reflection of the electromagnetic wave, there are known electromagnetic wave absorbent materials which are prepared by dispersing ferrite or a mixture of ferrite with metal powder or carbon powder into an organic polymer.

However, for the purpose of achieving a practically available absorbing characteristics by use of the above materials, it is necessary for the above materials to have a weight of 4 kg/m$^2$ or more and a film thickness of 1 mm or more even in the case of an electromagnetic wave having a narrow band frequency with an effective band width of 0.5 to 1 GHz exclusive, or to have a weight of about 12 kg/m$^2$ or more and a film thickness of 4.5 mm or more in the case of an electromagnetic wave having a broad band frequency with an effective band width of 1 to 5 GHz. Therefore, in use, the above electromagnetic wave absorbent material has such disadvantages that it is so heavy in weight and so thick in film thickness as to show poor application and working properties, that in the case where it is applied to building structures, etc., it is necessary to take strength and balance of the building structure as a a whole into consideration, and so forth. Thus, it has been of a great demand to develop an electromagnetic wave reflection-preventing material which is of a thin-gage film and weight-saved so as to show good application and working properties, and has improved electromagnetic wave shielding power and electromagnetic wave reflection-preventing power.

SUMMARY OF THE INVENTION

It is an object of the present invention to provide an electromagnetic wave reflection-preventing material and an electromagnetic wave reflection-preventing method, which are capable of shielding the electromagnetic wave and showing an highly improved electromagnetic wave reflection-preventing power.

The present invention relates to an electromagnetic wave reflection-preventing material having a structure formed by a process which comprises successively laminating (A) a pattern layer formed in the form of a geometrical pattern and having a volume resistivity of 10$^3$ Ω . cm or less, if needed, (B) a supporting layer, (C) a resin layer which may have a' void, and if needed, (D) a supporting layer, to form a laminate unit, laminating a plurality of the laminate unit so that the layer (A) may face on the layer (C) or (D) to form a multiple laminate unit structure, and laminating the multiple laminate unit structure onto (E) an electromagnetic wave reflecting material layer so that the layer (C) or (D) of the multiple laminate unit structure may face on the layer (E), preferably further laminating a clear or colored coating layer onto the uppermost metallic pattern layer of the electromagnetic wave reflection-preventing material; and an electromagnetic wave reflection preventing method which comprises applying the electromagnetic wave reflection-preventing material onto a structure, or which comprises applying the multiple laminate unit structure obtained by removing the electromagnetic wave reflecting material layer (E) from the electromagnetic wave reflection-preventing material onto an electromagnetic wave eflecting structure having a metallic surface.

A first embodiment of the electromagnetic wave reflection-preventing material in the present invention provides an electromagnetic wave reflection-preventing material having a structure formed by a process which comprises successively laminating (A-1) a metallic pattern layer formed in the form of a geometrical pattern, if needed, (B) a supporting layer, (C) a resin layer, and, if needed, (D) A supporting layer, to form a laminate unit, laminating a plurality of the laminate unit so that the layer (A) may face on the layer (C) or (D) to form a multiple laminate unit structure, and laminating the multiple laminate unit structure onto (E) an electromagnetic wave reflecting material layer so that the layer (C) or (D) of the multiple laminate unit structure may face on the layer (E), preferably further laminating a clear or colored coating layer onto the uppermost metallic pattern layer of the electromagnetic wave reflection-preventing material.

A second embodiment of the electromagnetic wave reflection-preventing material in the present invention provides an electromagnetic wave reflection-preventing material having a structure formed by a process which comprises successively laminating (A) a pattern layer formed in the form of a geometrical pattern, if needed, (B) a supporting layer, (C) a resin layer, and, if needed, (D) a supporting layer to form a laminate unit, laminating a plurality of the laminate unit so that the layer (A) may face on the layer (C) or (D) to form a multiple laminate unit structure, and laminating the multiple laminate unit structure onto (E) an electromagnetic wave refrecting material layer so that the layer (C) or (D) of the multiple laminate unit structure may face or the layer (E), at least one of the pattern layer (A)s in the multiple laminate unit structure being a coating pattern layer having a volume resistivity of $10^{-3}$ to $10^3$ $\Omega \cdot $ cm, and the pattern layer (A) other than the coating pattern layer in the multiple laminate unit structure being a metallic pattern layer, the coating pattern layer preferably being formed by coating a coating composition containing a film-forming resin and an electrically conductive powder, preferably further laminating a clear or colored coating layer onto the uppermost pattern layer of the electromagnetic wave reflection-preventing material.

A third embodiment of the electromagnetic wave reflection-preventing material in the present invention provides an electromagnetic wave reflection-preventing material having a structure formed by a process which comprises successively laminating (A) a pattern layer formed in the form of a geometrical pattern and having a volume resistivity of $10^3$ $\Omega \cdot $ cm or less, if needed, (B) a supporting layer, (C) a pattern resin layer having a void of 25 to 70% by volume, and, if needed, (D) a supporting layer to form a laminate unit, laminating a plurality of the laminate unit so that the layer (A) may face on the layer (C) or (D) to form a multiple laminate unit structure, and laminating the multiple laminate unit structure onto (E) an electromagnetic wave reflecting material layer so that the layer (C) or (D) of the multiple laminate unit structure may face on the layer (E), preferably further laminating a clear or colored coating layer onto the uppermost pattern layer of the electromagnetic wave reflection-preventing material.

DETAILED DESCRIPTION OF THE INVENTION

Figure 1:
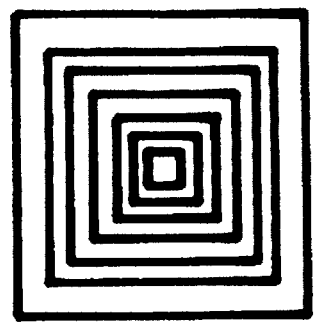
FIGS. 1–11 show examples of the pattern unit constituting the pattern layer (A) of the electromagnetic wave reflection-preventing material, in which the pattern unit is such a pattern that a plurality of band-shaped figures are combined so as not to contact with each other and to form a multi-figured structure, respectively.
Figure 2:
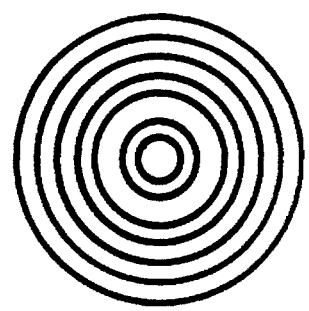
Figure 3:
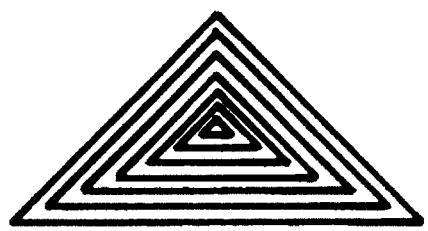
Figure 4:
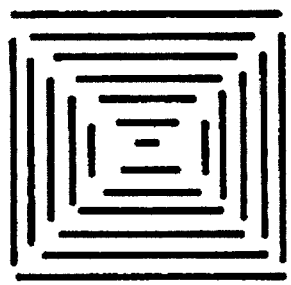
Figure 5:
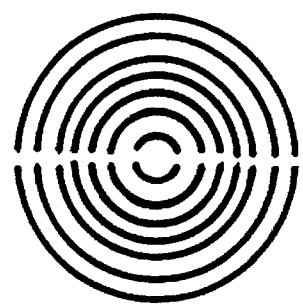
Figure 6:
Figure 7:
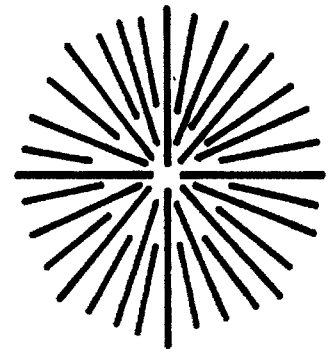
Figure 8:
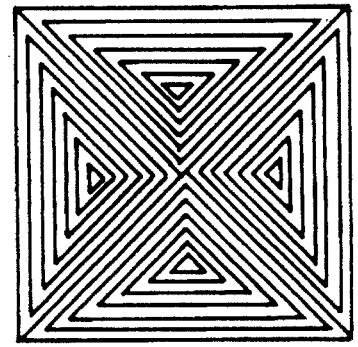
Figure 9:
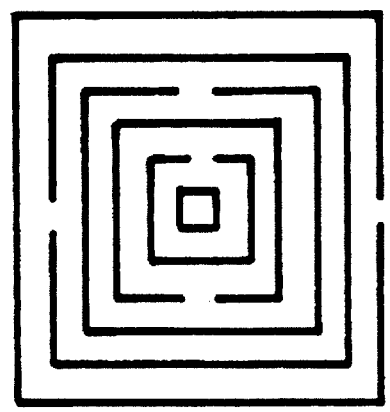
Figure 10:
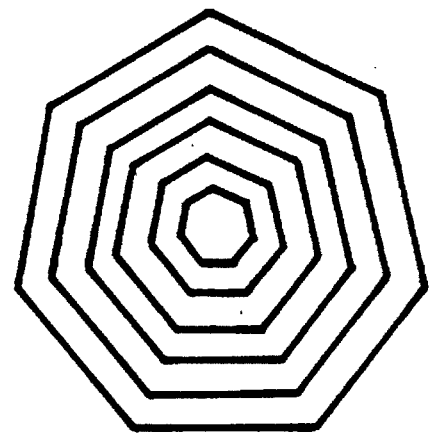
Figure 11:
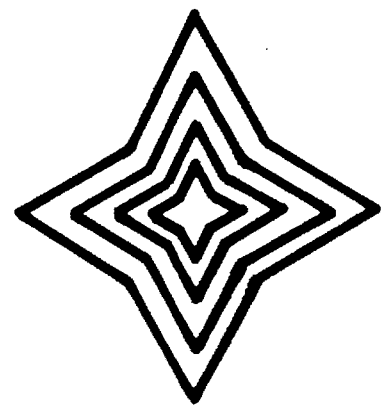

The resin layer (C) of the present invention may preferably contain at least one powder selected from ferrite, carbon, metal powder and electrically conductive metallic oxides, and, if needed, a good dielectric material.

In a preferable embodiment of the resin layer (C) of the first and second embodiments of the present invention, the resin layer (C) may be formed by coating a coating composition prepared by dispersing a powder of at least one selected from ferrite, carbon, metal powder and an electrically conductive metallic oxide, and, if needed, a good dielectric material into a binder, onto a substrate selected from a group consisting of a paper, cloth, nonwoven fabric and porous sheet followed by molding under pressure.

In a preferable embodiment of the pattern resin layer (C) of the third embodiment of the present invention, the resin layer (C) may be formed by coating a coating composition prepared by dispersing powder of at least one selected from a group consisting of ferrite, carbon, metal powder and electrically conductive metallic oxide, and, if needed, a good dielectric material into the above resin, onto paper, cloth, nonwoven fabric or porous sheet, followed by molding under pressure, and by punching; or may be formed by coating the coating composition in the form of a pattern thereonto, followed by molding under pressure.

In a preferable embodiment of the third embodiment of the present invention, the void of the pattern resin layer (C) may be filled with a material having a specific gravity less than that of the pattern resin layer (C), and the material filling the void of the pattern resin layer (C) may preferably be a resin free of ferrite, carbon, metal powder, electrically conductive metallic oxide or good dielectric material.

According to the electromagnetic wave reflection-preventing material of the first embodiment of the present invention, a metallic pattern layer (A-1) is laminated directly or through a supporting layer (B) onto the resin layer (C).

The above metallic pattern layer (A-1) may be formed directly onto the resin layer (C), or may be formed onto the supporting layer (B), followed by adhering the layer (B) of the resulting laminate onto the resin layer (C).

The pattern of the metallic pattern layer (A-1) may be formed by the known processes such as an etching process which comprises etching a metal foil or a metal sheet to form a pattern, a pattern plating process, a decalcomania process, and the like.

The etching process may include, for example, a process which comprises adhering a metal foil or a metal sheet onto the supporting layer (B), subjecting the metal foil or the metal sheet to a photoresist process or a printing process to form an etching resist layer, and etching away an exposed metal area not forming a resist layer.

The decalcomania process may include, for example, a process which comprises forming a metallic pattern onto a substrate for use in decalcomania transferring, and transferring the metallic pattern onto the supporting layer (B) or the resin layer (C).

The pattern plating process may include, for example, a process which comprises subjecting the resin layer (C) or the supporting layer (B) coated respectively with a plating catalyst such as platinum chloride to a photoresist process or an printing process to form a resist layer having a pattern, followed by subjecting to an electroless plating process to deposit metal in such an area only as not to be covered with a resist; a process which comprises subjecting the layer (B) or the layer (C) to an electroless plating process to form a thin plating layer, subjecting the plating layer to a photoresist process or a printing process to form a resist layer having a pattern, followed by subjecting to an electrolytic plating to carry out plating in a necessary thickness in such a plated area as not to be covered with a resist, removing the resists, and etching away the thin plating layer formed by the electroless plating process; and the like.

On forming the metallic pattern layer (A-1) onto the supporting layer (B), the supporting layer (B) may be adhered onto the resin layer (C) by use of an adhesive, followed by forming the metallic pattern layer (A-1) thereon, or the metallic pattern layer (A-1) may be formed onto supporting layer (B) itself, followed by adhering the supporting layer (B) of the resulting laminate onto the resin layer (C).

Examples of the metal constituting the metallic pattern layer (A-1) may include platinum, gold, silver, nickel, chromium, aluminium, copper, iron and the like. The thickness of the metal of the metallic pattern layer may preferably be in the range of 0.5 to 50 µm from the standpoints of strength, weight, etc.

A shape of the metallic pattern layer (A-1) may include any geometrical patterns formed by use of a plate-shaped or band-shaped metal, and may include, for example, ones obtained by forming a plate-shaped metal figure unit having a figure such as circle, square, polygon, ring, indeterminate form, or the like and by arranging a plurality of figure units in the form of a geometrical pattern such as checkered pattern, lattice pattern, stripe pattern, polka dotted pattern or the like, ones in the form of a band-shaped metal pattern unit comprising a pattern having a multi-figured structure as shown in FIG. 1–11 or a spiral pattern as shown in FIGS. 13–17, and ones obtained by arranging a plurality of pattern units in the form of checkered pattern, lattice pattern, stripe pattern, polka dotted pattern or the like.

A ratio of a metal-free area to a metal area on the surface when the metallic pattern layer (A-1) formed may preferably be 0.1 to 10 more preferably 0.2 to 5. A size of the figure constituting the pattern is such that in the case of a plate-shaped figure, a side length, diagonal distance and diameter are preferably 30 mm or less, and in the case of a band-shaped metal pattern unit comprising a pattern having a multi-figured structure or a spiral figure, a longest linear distance between arbitrarily selected two points on the metallic pattern in one pattern unit, for example, a longest diameter, a longest side length, etc., is preferably 300 mm or less.

According to the electromagnetic wave reflection-preventing material in the second and third embodiments of the present invention, the pattern layer (A) is laminated directly or through the supporting layer (B) onto the resin layer (C). The pattern layer (A) may be formed directly onto the resin layer (C), or may be formed onto the supporting layer (B), followed by adhering the supporting layer (B) to the resin layer (C). The supporting layer (D) may be laminated onto the resin layer (C) in the above laminate.

According to the electromagnetic wave reflection-preventing material in the second and third embodiments of the present invention, the pattern layer (A), if needed, the layer (B), the layer (C) and, if needed, the layer (D) are successively laminated to form a laminate unit, and a plurality of laminate units are further laminated to form a multiple laminate unit structure.

At least one of the pattern layer (A)s of the multiple laminate unit structure in the second embodiment of the present invention is a coating pattern layer (A-2) having a volume resistivity of $10^{-3}$ to $10^3$ Ω·cm. The coating pattern layer may be prepared by coating a coating composition or ink formulated by incorporating and dispersing at least one electrically conductive powder selected from a group consisting of metal powder, electrically conductive carbon powder and electrically conductive metallic oxide powder, and, if needed, a solvent, an antisagging agent, a defoamer, a pigment dispersant, other coating additives, etc. into the resin by the known process such as kneading, stirring or the like in the form of a pattern, followed by forming a coated film. The powder to be incorporated into the resin may be either amorphous or crystalline in the form of sphere, plate, square, whisker or the like.

Examples of the metal powder incorporated into the coating pattern layer (A-2) may include powders of metals such as nickel, aluminium, copper, iron, cobalt, zinc, tungsten and the like. The particle size and amount of the metal powder are not particularly limited, but the particle size is preferably 100 µm or less from the standpoint of dispersion properties, and the amount thereof is preferably 50 to 500 parts by weight per 100 parts by weight of the solid content of the resin.

The resin incorporated into the coating composition used in forming the coating pattern layer (A-2) may include film-forming resins, i.e. film-forming resins conventionally used in the field of coating composition and ink, for example, acrylic resin, polyester resin, epoxy resin, polyurethane, resin, polyamide resin, polyimide resin, polyvinyl chloride resin, butadiene-styrene rubber, nitrile rubber, natural rubber and the like. In use of the above resins, a curing agent such as aminoplast, polyisocyanate and the like, which is reacted and crosslinkable with the above resins, may also be incorporated thereinto.

The coating·composition used for forming the coating pattern layer (A-2) is coated onto the resin layer (C) or the supporting layer (B) by a process such as a pattern printing process by means of a screen printing, a masking process, a spray process by means of a figured pattern or the like to form a coating pattern layer. A film thickness of the coating pattern layer is preferably in the range of 10 to 500 µm.

The pattern layer (A) other than the coating pattern layer (A-2) in the multiple laminate unit structure in the second embodiment is a metallic pattern layer (A-3). In the case where all of the pattern layer (A)s are the coating pattern layer, the multiple laminate unit structure contains no metallic pattern layer.

Examples of the metal constituting the the metallic pattern layer (A-3) may include platinum, gold, silver, nickel, chromium, aluminium, copper, zinc, tungsten, iron and the like. A metal thickness of the metallic pattern layer is preferably in the range of 0.5 to 50 µm from the standpoints of strength, weight, etc.

It is empirically preferable from the standpoint of the electromagnetic wave absorption efficiency that the laminate unit containing the metallic pattern layer (A-3) may be arranged so as to be an interior one, but not to be an outer one facing outside.

The pattern of the metallic pattern layer (A-3) may be formed by the same process as that in the metallic pattern layer (A-1) of the first embodiment of the present invention.

The shape of the pattern layer (A) in the second embodiment is essentially the same as that of the metallic pattern layer (A-1) in the first embodiment of the present invention.

In the pattern layer (A)s of the multiple laminate unit structure in the third embodiment of the present invention, all of the pattern layer (A)s may be same as the metallic pattern layer (A-1) of the first embodiment of the present invention, or at least one of the pattern layer (A)s may be the coating pattern layer (A-2) and other pattern layer (A) be the metallic pattern layer (A-3) as in the second embodiment of the present invention.

An area ratio of a void area to a coating or metallic area in the pattern of the pattern layer (A) is preferably 0.1 to 10, more preferably 0.2 to 5. A size of a figure unit in the pattern is essentially the same as in the first embodiment of the present invention.

The supporting layer (B) used in the present invention is a layer which is laminated between the pattern layer (A) and the resin layer (C), if needed. The supporting layer (B) may be used, if needed, as a substrate for forming the pattern layer (A) or the resin layer (C). The supporting layer (B) may not particularly be limited, but generally includes a plastic sheet having a film thickness of 10 to 500 μm. The plastic sheet may include a plastic film. Examples of the plastic sheet may include ones comprising resins such as polyamide, polyimide, polyester such as polyethylene terephathalate, polyvinyl chloride, polyvinylidene chloride, polyurethane, Hypalon (chlorosulfonated polyethylene, trade name) rubber, chlorinated rubber, chloroprene rubber, epoxy resin, acrylic resin, phenolic resin and the like. The above plastic sheet may include a fiber-reinforced plastic sheet.

The supporting layer (D) used in the present invention is a layer which may be laminated, if needed, onto the resin layer (C) on an opposite side to the the pattern layer (A), and may be used, if needed, as a substrate for forming the resin layer (C), for example, by coating. The supporting layer (D) may be composed of ones usable as the supporting layer (B).

The resin layer (C) used in the first and second embodiments of the present invention may include resin, sheets, and examples of the resins constituting the resin, shellac, ester rubber, Hypalon (chlorosulfonated polyethylene, trade name) rubber, chlorinated rubber, chloroprene rubber, polyolefin resin, hydrocarbon resin, vinylidene chloride resin, polyamide resin, polyether ketone resin, vinyl chloride resin, polyester resin, alkyd resin, phenolic resin, epoxy resin, acrylic resin, urethane resin, silicone resin, cellulose resin, vinyl acetate resin, and the like.

The resin layer may be a molded sheet formed by molding a dispersion prepared by dispersing powder of at least one selected from a group consisting of ferrite, carbon, metal powder and electrically conductive metallic oxide, and, if needed, a good dielectric material into the above resin or the solution. The resin layer (C) may also be a coated film formed by coating the above dispersion onto the supporting layer (B) or the supporting layer (D), followed by drying. Further, the resin layer (C) may be a molded sheet obtained by coating the above dispersion onto paper, cloth, nonwoven fabric or porous sheet, followed by molding under pressure.

The thickness of the resin layer (C) used in the first and second embodiment of the present embodiments may not particularly be limited, but normally in the range of about 50 μm to 3 mm, preferably 100 μm to 2 mm.

The resin layer (C) used in the third embodiment of the present invention is a pattern layer having a void of 25 to 70% by volume, and may include ones obtained by molding the resin used in the resin layer (C) of the first embodiment of the present invention in the form of a sheet having a pattern, ones obtained by punching a sheet of the resin, and ones obtained by coating the resin or a resin solution of the resin in the form of a pattern, followed by drying.

The resin layer (C) having a void in the third embodiment of the present invention may also include ones obtained by molding the dispersion used in the formation of the resin layer (C) in the first embodiment of the present invention in the form of a sheet, followed by punching, ones obtained by molding the dispersion in the form of a sheet having a pattern, ones obtained by coating the dispersion onto a substrate in the form of a pattern, followed by drying, ones obtained by coating the dispersion onto a porous material such as paper, cloth, nonwoven fabric, porous sheet or the like, followed by molding under pressure, and punching, ones obtained by coating the dispersion onto the porous material in the form of a pattern, followed by molding under pressure, and the like.

A thickness of the resin layer (C) having a void is essentially the same as that of the resin layer (C) in the first embodiment of the present invention.

The ferrite to be dispersed into the resin or the resin solution in the present invention may include ferrites conventionally used in the electromagnetic wave absorber, typically, for example, may include hematite ($Fe_2O_3$), magnetite ($Fe_3O_4$), iron oxides represented by the general formular: $MO \cdot Fe_2O_3$ where M is Mn, Co, Ni, Cu, Zn, Ba, Mg, etc., and the like. The particle size of the ferrite may not particularly be limited, but preferably is 100 μm or less from the standpoints of dispersion properties, etc.

The carbon to be dispersed into the resin or the resin solution in the present invention may preferably include carbons having an electrical conductivity, for example, electrically conductive carbon, carbon fiber, etc. A particle size of the carbon or a diameter of the carbon fiber may not particularly be limited, but preferably is 100 μm or less from the standpoints of dispersion properties, etc.

The metal powder to be dispersed into the resin or the resin solution in the present invention may include, one comprising gold, platinum, silver, copper, nickel, aluminium, iron or the like.

The electrically conductive metallic oxide to be dispersed into the resin or the resin solution in the present invention may include metallic oxides having electric conductivity, for example, tin oxide and indium oxide.

The above metal powder and metallic oxide may be in the form of a particle or fiber, or may be in such a form that it may be formed as a thin film by deposition or the like onto a polymer powder or inorganic powder having the shape of a particle or fiber. A particle size of the particle or a diameter of the fiber may not particularly be limited, but may preferably be 100 μm or less from the standpoints of dispersion properties, etc.

The good dielectric material to be incorporated, if needed, in the resin or the resin solution in the present invention may include, for example, titanate compounds such as barium titanate, strontium titanate, ziroonium titanate, potassium titanate and the like in the form of a particle, whisker, etc., silicon carbide, silicon nitride, and the like. The above good dielectirc material may be in the form of a particle or a fiber. A particle size of the particle or a diameter may not particularly be limited, but may preferably be 100 μm or less from the standpoints of dispersion properties, etc.

The powder of at least one selected from the ferrite, carbon, metal powder and electrically conductive metallic oxide in the present invention may be used alone or in combination to be incorporated and dispersed into the resin or the resin solution. If needed, a good dielectric material may be incorporated into the above powder to be dispersed.

The amount of the above powder used 100 parts by weight of the binder may preferably be in the following ranges respectively.

When the ferrite used alone, in the range of 100 to 400 parts by weight.

When at least one of carbon, metal powder and electrically conductive metallic oxide used, in the range of 3 to 20 parts by weight.

When the mixture of ferrite with at least one of carbon, metal powder and electrically conductive metallic oxide, used, in the range of 3 to 400 parts by weight in total, a total amount of carbon, metal powder and electrically conductive metallic oxide being less than 20 parts by weight.

When the mixture of ferrite and good dielectric material used, in the range of 100 to 400 parts by weight in total, an amount of the good dielectric material being less than 50% by weight based on a total amount of the powder.

When the mixture of at least one of carbon, metal powder and electrically conductive metallic oxide with the good dielectric material used, in the range of 3 to 200 parts by weight in total, a total amount of carbon, metal powder and electrically conductive metallic oxide being less than 20 parts by weight.

When the mixture of ferrite, at least one of carbon, metal powder and electrically conductive metallic oxide, and the good dielectric material used, in the range of 3 to 400 parts by weight in total, a total amount of carbon, metal powder and electrically conductive metallic oxide being less than 20 parts by weight, an amount of the good dielectric material being preferably less than 50% by weight based on a total amount of the powder.

On dispersing the above powder into the resin or resin solution in the present invention, dispersion of the resin powder and the above powder by kneading may be carried out under heating, or may be carried out by the known process, for example, by incorporating, if needed, a solvent to dissolve or disperse the resin, followed by kneading, stirring or the like to disperse the above powder. Into the above dispersion may be incorporated a curing agent such as aminoplast, polyisocyanate, or the like.

When a resin layer (C) in the present invention is a molded sheet obtained by coating the above dispersion onto a substrate such as paper, cloth, nonwoven fabric or porous sheet, followed by molding under pressure, the substrate may not particularly be limited so long as it has a void and may be impregnated with the dispersion during coating and molding steps, preferably has a void content of 20 to 95%. Typical examples of the substrate may include cellulose based paper; cloth and nonwoven fabric obtained from fibers for example, synthetic fibers such as nylon fiber, polyester fiber, acrylic fiber, polyimide fiber and the like, carbon fiber, ceramic fibers such as titanate whisker, silicon carbide fiber and the like, natural fibers such as cotton yarn, flax, wool and the like; porous sheets such as a porous sintered material sheet comprising a ceramics obtained by sintering a mixture of an organic polymer with a ceramics, a foamed plastic sheet and the like; and the like. A thickness of the above substrate such as paper, cloth, nonwoven fabric and porous sheet may not particularly be limited, but normally in the range of about 50 µm to about 3 mm.

In the above coating and the molding under pressure, the above dispersion or a coating composition is coated onto the above substrate, followed by removing the solvent, if needed, by heating and molding under pressure to obtain the resin layer (C). If needed, the molding may be carried out under heating, the above molding also results in impregnation of the substrate with the dispersion or the coating composition. In the case where the binder in the dispersion or the coating composition is thermosetting, the molding by heating under pressure may preferably be carried out at the so-called B stage.

The pressure of the above molding may vary depending on a kind of the binder used and properties of the substrate, but generally is in the range of 20 to 500 kg/cm². The optional heating condition on molding may normally be in the range of room temperature to 250° C. A pressing time is normally in the range of one minute to 120 minutes. An impregnation percentage of the coating composition for the substrate to be occupied by the solid content of the coating composition is preferably 20 to 95% by volume based on the volume of the substrate including the void. The coating composition may be coated onto the substrate in such a coating weight that the thickness of the resin layer (C) may be normally about 50 µm to 3 mm, preferably 100 µm to 2 mm.

In the case where the pattern resin layer (C) having a void area in the third embodiment of the present invention is obtained by coating the resin, resin solution, dispersion or coating composition in the form of a pattern followed by drying, an applicable process may include a pattern printing process by means of a screen printing, gravure printing or the like, a pattern coating process by use of a pattern, and the like.

In the case where the void area of the pattern resin layer (C) having the void area is prepared by a punching process, and a material constituting the resin layer (C) is formed onto a supporting layer, when the resin layer (C) is subjected to the punching process, the supporting layer may also be provided with a void area.

The pattern resin layer (C) in the third embodiment of the present invention has a void area of 25 to 70% by volume. The void area of the pattern resin layer (C) means an area free of the above resin or solid content of the coating composition, which constitutes the resin layer (C) in the third embodiment of the present invention, and in the case where the resin or the coating composition is coated onto the porous material in the form of a pattern and molded under pressure may also include an area free of the resin or the solid content of the coating composition in the resulting porous material. When a proportion of the void area in the above resin layer (C) is less than 25% by volume, effect of weight-saving is not so remarkable, and when more than 70% by volume, strength and electromagnetic wave absorbing efficiency may be reduced. For example, the void area may be 50% by volume in this case of a checkered pattern free of void between non-void areas, 60% by volume in the case of such a pattern that circles having a diameter of 5 mm are arranged in a center distance of 7 mm, and 40% by volume in the case of a reverse pattern of the above pattern. An arrangement of the void area in the above resin layer (C) is not particularly limited, but it is preferable from the standpoints of the strength and isotropy of the electromagnetic wave reflection-preventing power of the resulting electromagnetic wave reflection-preventing material that the void area and non-void area are uniformly distributed all over the surface of the resin layer (C). The presence of the void area in the resin layer (C) makes it possible to achieve weight-saving without reducing the electromagnetic wave-absorbing efficiency of the resulting electromagnetic wave reflection-preventing material.

The resin layer (C) in the third embodiment of the present invention may also be such that the void area of the resin layer having the void area may be filled with a material having a specific gravity less than that of the material constituting the resin layer (C). The use of a resin free of ferrite, carbon, metal powder and good dielectric material as the above filling material is preferable from the standpoints of weight-saving, strength and the like. The use of the resin layer having the void area filled as above also makes it possible to achieve weight-saving without reducing electromagnetic wave-absorbing efficiency. The use of the resin layer (C) having the void area or the resin layer (C) having the void area filled with the material having the specific gravity less than that of the resin layer (C) makes it possible to reduce the weight of the electromagnetic wave reflection-preventing material by 20 to 50%.

According to the present invention, the function and effect of the resin layer (C) are not cleared, but it is considered that the resin layer (C) may function to vary a traveling path length of an electromagnetic wave which has entered inside through an area not occupied by a metal or a coating of the pattern layer (A), and reflects on the layer (A) interior or the layer (E) and leaves through the area not occupied by the metal or the coating of the outside, and that an interference between an electromagnetic wave reflected on the pattern layer (A) outside and the above electromagnetic wave having been varied in phase provides an effect to disappear energy of the electromagnetic wave. In connection therewith, incorporation of ferrite, carbon, metal powder and electrically conductive oxide compound into the resin layer (C) may increase change in the traveling path length, and may broaden the width of absorption band of the electromagnetic wave compared with the case where none is incorporated thereinto as above. Addition of the good dielectric material may provide a secondary effect in addition to the above effect. According to the first and second embodiments of the present invention incorporation of these powders results increase in weight; the use of these powders should be optionally selected depending on the purpose to use the electromagnetic wave reflection-preventing material. On the other hand, according to the third embodiment of the present invention, although incorporation of these powders results increase in weight, presence of the void area in the form of a pattern in the resin layer (C) achieves weight-saving without reducing the electromagnetic wave absorbing efficiency.

According to the electromagnetic wave reflection-preventing material of the present invention, the pattern layer (A), if needed, the supporting layer (B), the resin layer (C) and, if needed, the supporting layer (D) are successively laminated to form the laminate unit, and above layers may be adhered therebetween with an adhesive or the like.

According to the electromagnetic wave reflection-preventing material of the present invention, a plurality of the laminate unit are laminated so that the layer (A) may face on the layer (C) or (D) to form a multiple laminate unit structure, and the multiple laminate unit structure is laminated onto the electromagnetic wave reflecting material layer (E) so that the layer (C) or (D) of the multiple laminate unit structure may face or the layer (E).

According to the electromagnetic wave reflection-preventing material of the present invention, a number of laminate units to form the multiple laminate unit structure may not particularly be limited, but is normally in the range of 2 to 10, preferably 2 to 5. When the number is more than 10, the electromagnetic wave reflection-preventing effect may not be increased so much, but weight and thickness may rather disadvantageously be increased.

The metallic pattern layer (A-1) in the first embodiment of the present invention or the pattern layer (A) in the second and third embodiments of the present invention may be same or different between the laminate units in the material, kind and arrangement of the pattern. The resin layer (C) in the first and second embodiments of the present invention may be same or different between the laminate units, and the resin layer (C) in the third embodiment of the present invention may be same or different between the laminate units in the material, kind and arrangement of the pattern. The supporting layers (B) and (D) of the present invention are optionally used and may be same or different between the laminate units respectively.

According to the present invention, laminating a plurality of the laminate unit makes it possible to broaden a frequency band area capable of effectively preventing reflection of the electromagnetic wave.

The electromagnetic wave reflecting material layer (E) used in the electromagnetic wave reflection-preventing material of the present invention may include a metal layer which is capable of reflecting 100% to almost 100%, i.e., about 99% or more of an incident electromagnetic wave, generally includes a metal sheet. The metal sheet may include a metal foil. Examples of tinplate, brass, duralumin, copper, iron, nickel, stainless steel, aluminium and the like. The film thickness of the metal sheet may not particularly be limited, but is preferably in the range of 5 to 500 μm from the standpoints of strength and weight-saving.

According to the electromagnetic wave reflection-preventing material of the present invention, respective laminate units may be adhered therebetween with an adhesive to form the multiple laminate unit structure, and the multiple laminate unit structure and the electromagnetic wave reflecting material layer (E) may also be adhered therebetween with an adhesive to be laminated.

For the purpose of the improvement of the electromagnetic wave reflection-preventing material of the present invention in corrosion resistance, weather resistance, appearance, maintenance of material characteristics, etc., a clear or colored coating layer may be laminated onto the uppermost pattern layer (A). Examples of the resin constituting the coating layer may include epoxy resin, urethane resin, acrylic resin, polyester resin, and the like.

The electromagnetic wave reflection-preventing method of the present invention comprises applying the electromagnetic wave reflection-preventing material of the present invention onto a structure to shield electromagnetic wave and to prevent reflection of electromagnetic wave by adhering the electromagnetic wave reflection-preventing material onto the structure by use of an adhesive or the like, and makes it possible to effectively shield electromagnetic wave and prevent reflection of electromagnetic wave.

In the case where the above structure to shield electromagnetic wave and to prevent reflection of electromagnetic wave is an electromagnetic wave reflecting structure having a metallic surface, the electromagnetic wave reflecting structure may function like the electromagnetic wave reflecting material layer (E) of the present invention to shield electromagnetic wave and so forth. In the above case, another embodiment of the electromagnetic wave reflection-preventing method of the present invention comprises applying the multiple laminate unit structure obtained by removing the electromagnetic wave reflecting material layer (E) from the electromagnetic wave reflection-preventing material onto the electromagnetic wave reflecting structure having the metallic surface, and makes it possible to effectively prevent reflection of electromagnetic wave.

An adhering agent may be coated beforehand on the surface of the electromagnetic wave reflecting material layer (E) of the electromagnetic wave reflection-preventing material of the present invention, a release sheet may be laminated thereon, and the release sheet may then be separated for simply adhering to the structure to shield electromagnetic wave and to prevent reflection of electromagnetic wave in situ to form an electromagnetic wave reflection-preventing material onto the structure.

As evident from the results of Examples 1–5, 7–9, and 11–15, the electromagnetic wave reflection-preventing material of the present invention shows extremely low electromagnetic wave reflectance in spite of being thin in thickness and light in weight, and shows a wide effective absorption area. As evident from the results of Comparative Examples 1, 3 and 6, lack of electromagnetic wave reflecting material layer (E) of the present invention shows a very high electromagnetic wave reflectance and provides little effect of absorbing electromagnetic wave. As evident from the results of Comparative Examples 2, 4, 5 and 7, use of substantially only the ferrite-containing resin layer makes it necessary to use a thick laminate so that a low electromagnetic wave reflectance may be obtained, and shows a narrow effective absorption area.

It is considered from the above results that the electromagnetic wave reflection-preventing material has such a structure that the multiple laminate unit structure formed by laminating a plurality of the laminate unit essentially consisting of the pattern layer (A) and the resin layer (C) is laminated onto the electromagnetic wave reflecting material layer (E), and provides excellent electromagnetic wave reflection-preventing effect as the results of mutual, unexpected, special wave interference or wave energy negation between the multiple laminate unit structure and the electromagnetic wave reflecting material layer (E).

The results of Examples 6, 10, 14 as the examples of the electromagnetic wave reflection-preventing method comprising applying the multiple laminate unit structure obtained by removing the electromagnetic wave reflecting material layer (E) from the electromagnetic wave reflection-preventing material of the present invention onto an electromagnetic wave reflecting structure having a metallic surface show excellent electromagnetic wave reflection-preventing effect.

The present invention will be explained more in detail by the following Examples and Comparative Examples, in which "part" means "part by weight".

EXAMPLE 1

Onto a nonwoven fabric consisting of an aramid fiber and having a thickness of 100 μm was coated a coating composition containing 200 parts of a nickel based ferrite per 105 parts of a mixture of 100 parts of Epikote 828 (bisphenol A type resin, trade name, marketed by Shell Chemical Co., Ltd.) with 5 parts of diethylenetetramine as a curing agent so that a dry film thickness may be 100 μm when coated onto a smooth metallic surface, followed by leaving to stand at room temperature for 20 minutes, heating at 130° C. for 20 minutes under a pressure of 40 kg/cm$^2$, and heating and molding at 130° C. for 20 minutes to obtain a resin layer (C-1).

Figure 13:
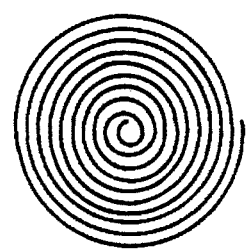
FIGS. 13–17 show examples of the pattern unit constituting the pattern layer (A) of the electromagnetic wave reflection-preventing material, in which the pattern unit is formed by a continuous band-shaped figure.
Figure 14:
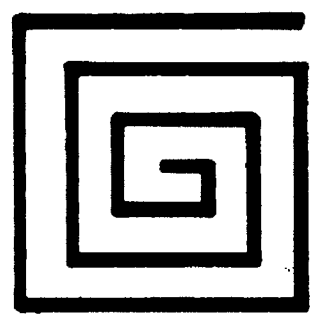
Figure 18:
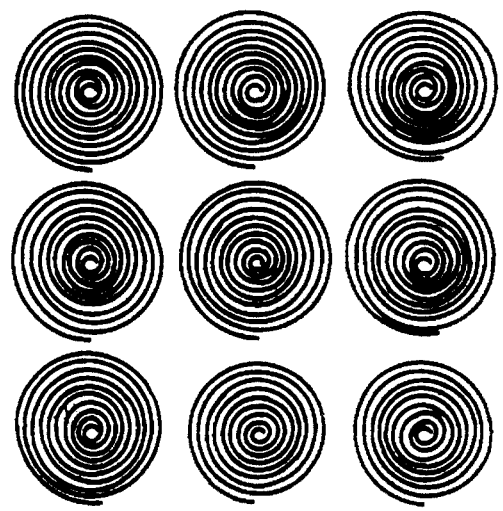
FIG. 18 shows an example of an arrangement of a pattern unit shown in FIG. 13 and constituting the pattern layer (A) of the electromagnetic wave reflection-preventing material.

Separately, onto a polyimide film layer (B-1) having a thickness of 50 μm was laminated a copper foil having a thickness of 18 μm, followed by coating thereonto a negative type photoresist SONNE EDUV 376 (marketed by Kansai Paint Co., Ltd.) to a film thickness of about 20 μm by the electrodeposition coating process, exposing to light in a dose of 100 mj/cm$^2$, by an ultrahigh mercury lamp through a negative type photomask having a pattern formed by arranging a pattern unit comprising such a spiral pattern that diameter of an outermost circular arc is about 5 mm, that a line width of the band is about 100 μm and that a line space between circular arcs of the band is about 100 μm as shown in FIG. 13, in such a lattice pattern that a minimum distance between pattern units may be 2 mm as shown in FIG. 18, developing with a 1% aqueous sodium carbonate solution, and removing a exposed copper with ferric chloride to obtain s copper pattern layer (A-1). The layer (B-1) having the layer (A-1) was adhered with an adhesive agent onto the layer (C-1) to obtain a laminate unit 1.

A pattern layer (A-2) was formed onto the layer (B-1) in the same manner as in obtaining the pattern layer (A-1) except that a photomask having a pattern obtained by arranging a 10 mm square in a checkered pattern was used as the negative type photomask. The layer (B-1) having the layer (A-2) was adhered with an adhesive agent onto a 300 μm thick polyethylene terephthalate sheet layer (C-2) to obtain a laminate unit 2. The layer (C-1) of the laminate unit 1 was adhered onto the layer (A-2) of the laminate unit 2 unit an adhesive agent to obtain a multiple laminate unit structure. A 50 μm thick aluminium foil layer (E-1) was adhered with an adhesive agent onto the layer (C-2) of the multiple laminate unit structure to obtain an electromagnetic wave reflection-preventing material.

EXAMPLE 2

A coating composition containing 200 parts of barium based ferrite, 5 parts of electrically conductive carbon and 50 parts of barium titanate per 100 parts of an acrylic resin, was coated to be a dry film thickness of 50 μm onto a polyimide film layer (D-3) having a thickness of 80 μm to form a resin layer (C-3).

Separately, onto the supporting layer (B-1) was formed a pattern layer (A-3) in the same manner as in the pattern layer (A-1) of Example 1 except for using a negative type photomask having a pattern formed by arranging a pattern unit comprising such a pattern that a longest side length of an outermost figure is about 20 mm, that a band width is about 250 μm and that a space or band interval between bands is about 250 μm as shown in FIG. 1, so that a minimum distance between pattern units upward and downward as well as from side to side respectively may be about 1 mm. The layer (D-3) having the layer (C-3) was adhered onto the layer (B-1) having the layer (A-3) with an adhesive so that the layer (C-3) may face on the layer (B-1) to obtain a laminate unit 3.

Next, the layer (C-1) of the laminate unit 1 in Example 1 was adhered onto the layer (A-3) of the laminate unit 3 and layer (D-3) of the above laminate unit 3 was adhered onto the layer (A-2) of the laminate unit 2 in Example 1 with an adhesive respectively to obtain a multiple laminate unit structure. Onto the layer (C-2) of the multiple laminate unit structure was adhered a 50 μm thick aluminium foil layer (E-1) with an adhesive to obtain an electromagnetic wave reflection-preventing material.

EXAMPLE 3

A resin layer (C-4) was formed in the same manner as in obtaining the layer (C-1) of Example 1 except that a potassium titanate whisker nonwoven fabric having a thickness of 250 μm in place of the aramid fiber monowoven fabirc having a thickness of 100 μm, and that the coating composition was coated so that a dry film thickness may be 300 μm when coated onto a smooth metallic surface. The layer (B-3) having the layer (A-3) in Example 2 was adhered onto the above layer (C-4) with an adhesive to obtain a laminate unit 4. The layer (C-4) of the above laminate unit 4 was adhered onto the layer (A-2) of the laminate unit 2 in Example 1 with an adhesive to obtain a multiple laminate unit structure. Onto the layer (C-2) of the multiple laminate unit structure was adhered a 50 μm thick aluminium foil layer (E-1) with an adhesive to obtain an electromagnetic wave reflection-preventing material.

EXAMPLE 4

The layer (C-3) having the layer (D-3) in Example 2 was adhered onto the layer (B-1) having the layer (A-1) in Example 1 with an adhesive so that the layer (C-3) may face on the layer (B-1) to obtain a laminate unit 5. The layer (D-3) of the above laminate unit 5 was adhered onto the layer (A-3) of the laminate unit 3 in Example 2 with an adhesive to obtain a multiple laminate unit structure. Onto the layer (D-3) of the multiple laminate unit structure was adhered a 50 μm thick aluminum foil layer (E-1) with an adhesive to obtain an electromagnetic wave reflection-preventing material.

EXAMPLE 5

The procedures of forming the copper pattern layer (A-1) in Example 1 were repeated except that layers (A-4), (A-5), (A-6) and (A-7) having a pattern formed by arranging a pattern unit comprising a spiral pattern as shown in FIG. 13, in such a lattice pattern that a minimum distance between pattern units may be about 2 mm as shown in FIG. 18, and having a diameter of the outermost circular arc, a line width of the band and a line space between circular arcs of the band as shown Table 1 respectively were used in place of the layer (A-1) as the negative type photomask and formed onto the layer (B-1) respectively.

TABLE 1

|       | Diameter of outermost circular arc (mm) | Line width of the band (μm) | Line space between circular arcs of the band (μm) |
|-------|------|-----|-----|
| (A-1) | 5    | 100 | 100 |
| (A-4) | 15   | 200 | 500 |
| (A-5) | 12   | 150 | 300 |
| (A-6) | 10   | 150 | 200 |
| (A-7) | 7.5  | 100 | 150 |

Separately, a resin layer (C-5) was formed in the same manner as in the layer (C-1) of Example 1 except that the nickel based ferrite was used in an amount of 50 parts in place of 200 parts.

Onto the layer (B-1) of the layer (B-1) having the layer (A-1) in Example 1 was adhered the above layer (C-5) with an adhesive to obtain a laminate unit 6.

Separately, onto respective layer (B-1)$_s$ of the layer (B-1)$_s$ having the layers (A-4), (A-5), (A-6) and (A-7) respective was adhered the above layer (C-5) with an adhesive respectively to obtain laminate units 7, 8, 9 and 10 respectively. The laminate unit 7 has the layer (A-4), the laminate unit 8 has the layer (A-5), the laminate unit 9 has the layer (A-6) and the laminate unit 10 has the layer (A-7) respectively.

Next, the layer (A-1) of the laminate unit 6 was adhered onto the layer (C-5) of the laminate unit 10 with an adhesive, followed adhering the laminate unit 9 onto the layer (A-7) of the above laminate unit 10, adhering the laminate unit 8 onto the layer (A-6) of the above laminate unit 9, and by adhering the laminate 7 onto the layer (A-5) of the above laminate unit 8 so that the layers (A-7), (A-6) and (A-5) may face on the layer (C-5) respectively to obtain a multiple laminate unit structure having such a structure that the laminate units 6, 10, 9, 8 and 7 are successively laminated. Onto the layer (C-5) of the above multiple laminate unit structure was adhered a 50 μm thick aluminum foil layer (E-1) with an adhesive to obtain an electromagnetic wave reflection-preventing material.

EXAMPLE 6

The experiments of Example 1 were repeated to obtain an electromagnetic wave reflection-preventing structure except that a steel pole of 300 mm×300 mm×1000 mm as a structure having a metallic surface was used in place of the aluminium foil layer (E-1) in Example 1, and that an urethane clear coating layer was further formed onto the pattern layer (A).

COMPARATIVE EXAMPLE 1

A comparative laminate remaining after removing the aluminium foil layer (E-1) from the electromagnetic wave reflection-preventing material in Example 1 was used as Comparative Example 1.

COMPARATIVE EXAMPLE 2

Onto a polyimide film layer (B) having a thickness of 50 μm was coated and dried a coating composition containing 300 parts of barium based ferrite per 100 parts of acrylic resin to be a dry film thickness of 3 mm to obtain a comparative laminate consisting of the above layer (B) and the ferrite-containing resin layer formed thereon as Comparative Example 2.

PREPARATION EXAMPLE 1

A coating composition containing 200 parts of barium based ferrite per 100 parts of acrylic resin was coated to be a dry film thickness of 100 μm onto a polyimide film layer (D) having a thickness of 25 μm to form a resin layer (C). Separately, onto a polyimide film layer (B) having a thickness of 25 μm was printed an electrically conductive ink containing 200 parts of nickel powder per 100 parts of acrylic resin so that such a pattern unit that an outermost figure has a side of about 20 mm, that a band has a width of about 250 μm, and that a space between bands is about 250 μm as shown in FIG. 1 may be arranged to be spaced upward and downward by 1 mm and spaced from side to side by 1 mm to form a pattern coating layer (A) having a thickness of about 35 μm and a volume resistivity of $3.1 \times 10^{-3}$ Ω·cm. Next the layer (D) having the above layer (C) was adhered onto the layer (B) having the layer (A) with an adhesive so that the layer (C) may face on the layer (B) to obtain a laminate unit 11.

PREPARATION EXAMPLE 2

Onto a release paper was coated and dried to be a dry film thickness of about 75 μm a coating composition containing 150 parts of a nickel based ferrite, and 10 parts of powders prepared by coating barium sulfate powders with an indium-tin oxide film to a thickness of about 10 μm by spattering per 105 parts of a mixture of 100 parts of Epikote 828 with 5 parts of diethylenetetramine as a curing agent to form a resin layer (C) on the release paper.

Figure 12:
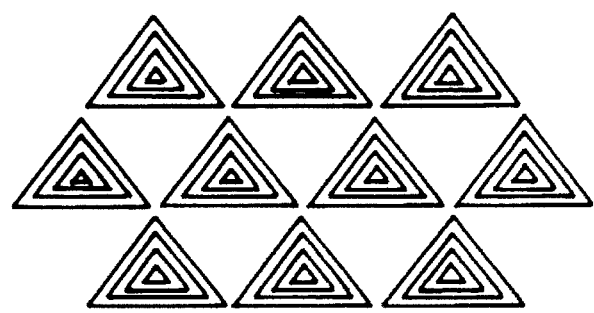
FIG. 12 shows an example of an arrangement of a pattern unit shown in FIG. 3 and constituting the pattern layer (A) of the electromagnetic wave reflection-preventing material in the present invention.
Figure 15:
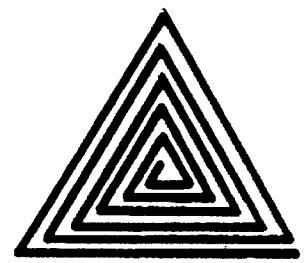
Figure 16:
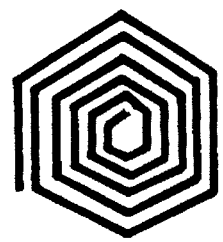
Figure 17:
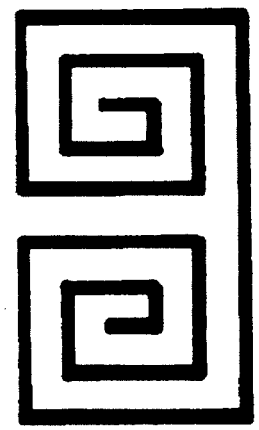

Onto the above resin layer (C) was arranged and printed a pattern unit shown in FIG. 15 and having a shape of a triangle, a longest side length of about 12 mm in the outermost triangle, a line width of 100 μm and a line space of 100 μm by use of an electrically conductive ink containing 150 parts of nickel powder per 100 parts of acrylic resin in an arranged pattern as shown in FIG. 12 so that a distance between apexes of respective pattern units may be 0.5 mm respectively to form a pattern coating layer (A) having a thickness of about 50 μm and a volume resistivity of $2.3 \times 10^{-1}$ Ω . cm, followed by removing the release paper to obtain a laminate unit 12.

PREPARATION EXAMPLE 3

Onto a polyester film layer (D) having a thickness of 25 μm was coated a coating composition containing 100 parts of barium based ferrite and 10 parts of an electrically conductive carbon per 100 parts of acrylic resin so that a dry film thickness may be 200 μm to form a resin layer (C). Onto the above layer (C) was arranged and printed a pattern unit shown in FIG. 7 and having a longest band length of 12 mm, a line width of 200 μm and 32 segmental bands per one pattern unit by use of an electrically conductive ink containing 100 parts of nickel powder per 100 parts of acrylic resin in such an arranged pattern that a space between respective pattern units may be 5 mm upward and downward, and from side to side respectively to form a pattern coating layer (A) having a thickness of about 25 μm and a volume resistivity of 7.5 Ω . cm, resulting in obtaining a laminate unit 13.

PREPARATION EXAMPLE 4

Onto a nonwoven fabric consisting of an aramid fiber having a thickness of about 100 μm was coated a coating composition containing 5 parts of an electrically conductive carbon and 150 parts of barium titanate powder per 105 parts of a mixture of 100 parts of Epikote 828 with 5 parts of diethylenetetramine as a curing agent so that a dry film thickness may be 100 μm when coated onto a smooth metallic surface, followed by heating at 80° C. for 10 minutes, and pressing under a pressure of 50 kg/cm² for 60 minutes while heating at 100° C. to form a molded sheet having a thickness of about 100 μm as a resin layer (C). Separately, onto a polyimide film layer (B) having a thickness of 25 μm was laminated a copper foil having a thickness of 12 μm, followed by coating thereonto a negative type photoresist SONNE EDUV 376 (marketed by Kansai Paint Co., Ltd.) to a film thickness of about 20 μm by the electrodeposition coating process, exposing to light in a dose of 100 jm/cm² by an ultrahigh mercury lamp through a negative type photomask having a pattern formed by arranging a 15 mm regular square in a checkered pattern, developing with a 1% aqueous sodium carbonate solution, and removing a exposed copper with ferric chloride to obtain a metallic pattern layer (A). A thermocompression bonding sheet was inserted between the above layer (C) and the layer (B) of the layer (B) having the above layer (A), followed by pressing while heating at 180° C. to obtain a laminate unit 14.

EXAMPLE 7

The layer (C) of the laminate unit 12 was adhered onto the layer (A) of the laminate unit 11 with an adhesive, in the same manner as above followed by adhering the layer (D) of the above laminate unit 11 onto the layer (A) of the laminate unit 14, and by adhering the layer (C) of the above laminate unit 14 onto a 25 μm thick aluminium foil layer (E) to obtain an electromagnetic wave reflection-preventing material.

EXAMPLE 8

The layer (D) of the laminate unit 13 was adhered onto the layer (A) of the laminate unit 14, followed by adhering the layer (C) of the above laminate unit 14 onto a 12 μm thick copper foil layer (E) with an adhesive respectively to obtain an electromagnetic wave reflection-preventing material.

EXAMPLE 9

The layer (D) of the laminate unit 13 was adhered onto the layer (A) of the laminate unit 12, followed by adhering the layer (C) of the above laminate unit 12 onto the layer (A) of the laminate unit 11, adhering the layer (D) of the laminate unit 11 onto the layer (A) of the laminate unit 14, and by adhering the layer (C) of the above laminate unit 14 onto a 25 μm thick aluminum foil layer (E) with an adhesive respectively to obtain an electromagnetic wave reflection-preventing material.

EXAMPLE 10

The experiments of Example 7 were repeated except that an urethane acrylate clear coating composition was coated onto the uppermost layer (A) of the electromagnetic wave reflection-preventing material in Example 7 to form a clear coating film having a dry film thickness of about 50 μm, and that a steel pole of 300 mm×300 mm×1000 mm as a structure having a metallic surface was used in place of the aluminium foil layer (E) in the above electromagnetic wave reflection-preventing material to obtain an electromagnetic wave reflection-preventing structure.

COMPARATIVE EXAMPLE 3

The aluminium foil layer (E) of the electromagnetic wave reflection-preventing material in Example 1 was removed therefrom to be used as Comparative Example 3.

COMPARATIVE EXAMPLE 4

Onto a polyimide film layer having a thickness of 25 μm was coated and dried a coating composition containing 200 parts of barium based ferrite per 100 parts of acrylic resin to be a dry film thickness of 3 mm to obtain a comparative laminate consisting of the polyimide film layer and the ferrite-containing resin layer formed thereon, followed by adhering a 25 μm thick aluminium foil layer onto the polyimide film layer of the above laminate to obtain a comparative laminate structure as Comparative Example 4.

COMPARATIVE EXAMPLE 5

A comparative laminate was formed in the same manner as in the formation of the comparative laminate in Comparative example 4 except that a dry film thickness of the ferrite-containing coating layer is 1 mm. Three of the above comparative laminate were adhered to each other between the polyimide film layer and the ferrite-containing coating layer with an adhesive respectively to obtain a comparative multiple laminate structure, followed by adhering a 25 μm thick aluminium foil layer onto the polyimide film layer of the above comparative multiple laminate structure to obtain a comparative electromagnetic wave reflection-preventing material.

PREPARATION EXAMPLE 5

Onto a polyimide film layer (D) having a thickness of 50 μm was placed a figured pattern prepared by punching a 5 mm regular square at an interval of 2 mm upward and downward as well as from side to side, followed by coating thereonto a coating composition containing 200 parts of nickel based ferrite per 100 parts of an acrylic resin to be a dry film thickness of 300 μm to obtain a resin layer (C) having such a pattern that the 5 mm regular square is regularly arranged upward and downward as well as from side to side and that a void area of the pattern is 49% by volume.

Separately, onto a polyimide film layer (B) having a thickness of 50 μm was printed an electrically conductive ink containing 200 parts of nickel powder per 100 parts of acrylic resin so that such a pattern unit that an outermost figure has a side of about 20 mm, that a band has a width of about 250 μm, and that a space between bands is about 250 μm as shown in FIG. 1 may be arranged to be spaced upward and downward by 1 mm and spaced from side to side by 1 mm to form a pattern coating layer (A) having a thickness of about 35 μm and a volume resistivity of $3.1 \times 10^{-3}$ Ω . cm. Next, the layer (C) of the layer (C) having the above layer (D) was adhered onto the layer (B) of the layer (A) having the layer (B) with an adhesive to obtain a laminate unit 15.

PREPARATION EXAMPLE 6

Onto a nonwoven fabric consisting of silicon carbide whisker and having a thickness of 120 μm was coated a coating composition containing 50 parts of barium titanate, 5 parts of electrically conductive carbon and 150 parts of barium based ferrite per 100 parts of acrylic resin so that a dry film thickness may be 200 μm when coated onto a smooth metallic surface, and so that a circular pattern having a diameter of 3 mm may be arranged in a lattice pattern at a center distance of 4 mm by a screen printing process, followed by heating at 80° C. for 60 minutes to evaporate the solvent contained in the coating composition, and molding under the conditions of a temperature of 140° C. and a pressure of 40 kg/cm² for 10 minutes to obtain a pattern resin layer (C) having a void area of 44% by volume and a thickness of about 200 μm. Separately, a pattern coating layer (A) having a dry film thickness of 50 μm, having a volume resistivity of $2.3 \times 10^{-1}$ Ω . cm and having a 15 mm square checkered pattern formed by use of an electrically conductive ink containing 150 parts of nickel powder per 100 parts of acrylic resin was formed onto a polyimide film layer (B) having a thickness of 25 μm by a screen printing process. A thermocompression bonding sheet was inserted between the layer (B) of the layer (A) having the above layer (B) and the above layer (C), followed by pressing and laminating at 180° C. to obtain a laminate unit 16.

PREPARATION EXAMPLE 7

Onto a polyethylene terephthrarate film layer (D) having a thickness of 25 μm was coated a coating composition containing 150 parts of nickel based ferrite and 75 parts of strontium titanate per 105 parts of a mixture of 100 parts of Epikote 828 (bisphenol A type epoxy resin, trade name, marketed by Shell Chemical Co., Ltd.) with 5 parts of diethylenetetramine as a curing agent so that a dry film thickness may be 150 μm and so that a stripe pattern having a line width of 300 μm and a line space of 300 μm may be formed by a screen printing process, followed by leaving to stand at room temperature for 60 minutes, heat curing at 130° C. for 40 minutes, following the void area of the above stripe pattern with a clear coating composition obtained by removing the nickel based ferrite and strontium titanate from the above coating composition, and by curing to obtain a resin layer (C).

Separately, onto a polyimide film layer (B) having a thickness of 25 μm was laminated a copper foil having a thickness of 12 μm, followed by coating thereonto a negative type photoresist SONNE EDUV 376 (marketed by Kansai Paint Co., Ltd.) to a film thickness of about 20 μm by the electrodeposition coating process, exposing to light in a dose of 100 mj/cm² by an ultrahigh mercury lamp through a negative type photomask having a pattern formed by arranging a pattern unit comprising such a spiral pattern that a diameter of an outermost circular arc is about 7 mm, that a line width of the band is about 100 μm and that a line space between circular arcs of the band is about 100 μm as shown in FIG. 13, in such a lattice pattern that a minimum distance between pattern units may be 0.2 mm as shown in FIG. 18, developing with a 1% aqueous sodium carbonate solution, and removing a exposed copper with ferric chloride to obtain a copper pattern layer (A).

The layer (C) of the layer (C) having the above layer (D) was adhered onto the layer (B) of the layer (A) having the layer (B) with an adhesive to obtain a laminate unit 17.

PREPARATION EXAMPLE 8

The experiments of Preparation Example 5 were repeated except that an acrylic resin based clear coating composition free of nickel based ferrite was used as a coating composition to form the resin layer (C) onto the layer (D) and that the dry film thickness was changed from 300 μm to 200 μm to obtain a laminate unit 18.

EXAMPLE 11

The layer (D) of the laminate unit 16 obtained in Preparation Example 6 was adhered onto the layer (A) of the laminate unit 17 obtained in Preparation Example 7 with an adhesive, followed by adhering the layer (D) of the laminate unit 17 onto a 25 μm thick aluminium foil layer (E) to obtain an electromagnetic wave reflection-preventing material.

EXAMPLE 12

The layer (D) of the laminate unit 16 obtained in Preparation Example 6 was adhered onto the layer (A) of the laminate unit 15 obtained in Preparation Example 5 with an adhesive, followed by adhering the layer (D) of the laminate unit 15 onto the layer (A) of the laminate unit 18 obtained in Preparation Example 8, and by adhering the layer (D) of the laminate unit 18 onto a 12 μm thick copper foil layer (E) respectively to obtain an electromagnetic wave reflection-preventing material.

EXAMPLE 13

The layer (D) of a laminate unit 15 obtained in Preparation Example 5 was adhered onto the layer (A) of another laminate unit 15 with an adhesive, followed by adhering the layer (D) of another laminate unit 15 onto a 25 μm thick aluminum foil layer (E) to obtain an electromagnetic wave reflection-preventing material.

EXAMPLE 14

The experiments of Example 11 were repeated to obtain an electromagnetic wave reflection-preventing structure except that a steel pole of 300 mm×300 mm×1000 mm as a structure having a metallic surface was used in place of the aluminium foil layer (E) in Example 11, and that an urethane clear coating layer having a dry film thickness of about 50 μm was further formed onto the uppermost pattern layer (A).

COMPARATIVE EXAMPLE 6

A multiple laminate unit structure obtained by removing the aluminium foil layer (E) from the electromagnetic wave reflection preventing material obtained in Example 11 was used as a comparative electromagnetic wave reflection-preventing material of Comparative Example 6.

COMPARATIVE EXAMPLE 7

Onto a polyimide film layer (B) having a thickness of 50 μm was coated and dried a coating composition containing 200 parts of barium based ferrite per 100 parts of acrylic resin to be a dry film thickness of 3 mm to obtain a comparative laminate consisting of the above layer (B) and the ferrite-containing resin layer formed thereon as Comparative Example 7.

The electromagnetic wave reflection-preventing materials in Examples 1–5, 7–9 and 11–13, the electromagnetic wave reflection-preventing structures in Examples 6, 10 and 14, and the comparative electromagnetic wave reflection-preventing material or laminates in Comparative Examples 1–7 were subjected to measurements of the electromagnetic wave reflection-preventing effect by the following method. The results are shown in the following Tables 2, 3 and 4. The weights of the electromagnetic wave reflection-preventing materials in Examples 1–5, 7–9 and 11–13, and the laminates of Comparative Examples 1–4, are shown in Tables 2, 3 and 4. Regarding to Examples 6, 10 and 14, the weight of the multiple laminate unit structure adhered onto the steel pole, excepting for the steel pole itself, is shown in Tables 2, 3 and 4.

Method of measuring the electromagnetic wave reflection-preventing effect

A transmitting horn antenna and a receiving horn antenna was set within a microwave dark room, onto the wall of which was adhered an electromagnetic wave absorber having an electromagnetic wave reflectance of 0.01% or less, so that an angle between an incident electromagnetic wave and reflected electromagnetic wave may be 5°, and a metallic reflecting plate was placed at a distance of 50 cm from respective antennas thereafter, reflected signals are received by the receiving horn antenna to measure the resulting electromagnetic wave reflectance to be 100%. Next, a measuring sample was placed in place of the metallic reflecting plate to measure a maximum absorption frequency, an electromagnetic wave reflectance at the maximum absorption frequency, and an effective absorption frequency range, which is a frequency range to show an electromagnetic wave reflectance of 1% or less around the maximum absorption frequency, from signals reflected from the surface of the measuring sample over varied frequencies.

TABLE 2

| Example | Maximum absorption frequency (GHz) | Electromagnetic wave reflectance (%) | Effective absorption frequency area (GHz) | Weight (kg/m$^2$) | Thickness (mm) |
|---|---|---|---|---|---|
| Example 1 | 9.2 | 0.2 | 4.6–13.7 | 1.00 | 0.74 |
| Example 2 | 8.1 | 0.2 | 3.8–12.6 | 1.45 | 0.89 |
| Example 3 | 9.6 | 0.2 | 4.5–14.1 | 1.64 | 0.79 |
| Example 4 | 10.8 | 0.1 | 7.0–13.8 | 0.90 | 0.45 |
| Example 5 | 9.3 | 0.3 | 3.8–14.6 | 2.00 | 0.90 |
| Example 6 | 9.3 | 0.2 | 4.8–13.6 | 0.95 | 0.74 |
| Comp. Ex. 1 | 9.5 | 63.3 | — | 0.90 | 0.69 |
| Comp. Ex. 2 | 11.2 | 0.9 | 10.5–11.6 | 8.70 | 3.05 |

TABLE 3

| Example | Maximum absorption frequency (GHz) | Electromagnetic wave reflectance (%) | Effective absorption frequency area (GHz) | Weight (kg/m$^2$) | Thickness (mm) |
|---|---|---|---|---|---|
| Example 7 | 7.7 | 0.3 | 4.1–12.8 | 0.91 | 0.47 |
| Example 8 | 8.6 | 0.2 | 5.1–14.3 | 0.83 | 0.41 |
| Example 9 | 8.8 | 0.3 | 4.3–14.9 | 1.32 | 0.72 |
| Example 10 | 7.8 | 0.3 | 4.3–12.9 | 0.90 | 0.45 |
| Comp. Ex. 3 | 7.7 | 61.6 | — | 0.90 | 0.45 |
| Comp. Ex. 4 | 11.2 | 0.9 | 10.5–11.6 | 6.67 | 3.05 |
| Comp. Ex. 5 | 10.9 | 0.9 | 10.3–11.5 | 6.74 | 3.10 |

TABLE 4

| Example | Maximum absorption frequency (GHz) | Electromagnetic wave reflectance (%) | Effective absorption frequency area (GHz) | Weight (kg/m$^2$) | Thickness (mm) |
|---|---|---|---|---|---|
| Example 11 | 7.8 | 0.2 | 3.3–12.3 | 0.89 | 0.55 |
| Example 12 | 8.4 | 0.2 | 3.8–13.2 | 1.11 | 1.26 |
| Example 13 | 8.9 | 0.2 | 4.7–12.9 | 1.02 | 0.93 |
| Example 14 | 7.7 | 0.2 | 3.4–12.3 | 0.88 | 0.53 |
| Comp. Ex. 6 | 8.7 | 70.6 | — | 0.48 | 0.44 |
| Comp. Ex. 7 | 11.2 | 0.9 | 10.5–11.6 | 6.67 | 3.05 |

What is claimed is:

1. An electromagnetic wave reflection-preventing material having a structure which has been formed by a process which comprises successively laminating (A) a pattern layer formed in the form of a geometrical pattern and having a volume resistivity of $10^3$ Ω · cm or less, (B) a supporting layer, (C) a resin layer, and (D) a supporting layer, to form a laminate unit, laminating a plurality of the laminate unit so that the layer (A) may face on the layer (D) to form a multiple laminate unit structure, and laminating the multiple laminate unit structure onto (E) an electromagnetic wave reflecting material layer having a thickness of 5 to 500 μm so that the layer (D) of the multiple laminate unit structure may face on the layer (E).

2. An electromagnetic wave reflection-preventing material having a structure which has been formed by a process which comprises successively laminating (A) a pattern layer formed in the form of a geometrical pattern and having a volume resistivity of $10^3$ Ω . cm or less, (B) a supporting layer, and (C) a resin layer, to form a laminate unit, laminating a plurality of the laminate unit so that the layer (A) may face on the layer (C) to form a multiple laminate unit structure, and laminating the multiple laminate unit structure onto (E) an electromagnetic wave reflecting material layer having a thickness of 5 to 500 μm so that the layer (C) of the multiple laminate unit structure may face on the layer (E).

3. An electromagnetic wave reflection-preventing material having a structure which has been formed by a process which comprises successively laminating (A) a pattern layer formed in the form of a geometrical pattern and having a volume resistivity of $10^3$ Ω. cm or less, (C) a resin layer, and (D) a supporting layer, to form a laminate unit, laminating a plurality of the laminate unit so that the layer (A) may face on the layer (D) to form a multiple laminate unit structure, and laminating the multiple laminate unit structure onto (E) an electromagnetic wave reflecting material layer having a thickness of 5 to 500 μm so that the layer (D) of the multiple laminate unit structure may face on the layer (E).

4. An electromagnetic wave reflection-preventing material having a structure which has been formed by a process which comprises successively laminating (A) a pattern layer formed in the form of a geometrical pattern and having a volume resistivity of $10^3$ Ω. cm or less, and (C) a resin layer, to form a laminate unit, laminating a plurality of the laminate unit so that the layer (A) may face on the layer (C) to form a multiple laminate unit structure, and laminating the multiple laminate unit structure onto (E) an electromagnetic wave reflecting material layer having a thickness of 5 to 500 μm so that the layer (C) of the multiple laminate unit structure may face on the layer (E).

5. The electromagnetic wave reflection-preventing material as claimed in claim 1, 2, 3 or 4, wherein said (A) a pattern layer is (A-1) a metallic pattern layer which has a dry film thickness of 0.5 to 50 μm and has been prepared in the form of a geometrical pattern, said geometrical pattern being selected from the group consisting of (a) a plurality of plate-shaped metal figure units arranged in the form of said geometrical pattern, (b) a band-shaped metal pattern unit having a multi-figured structure, (c) a band-shaped metal pattern unit having a spiral shape, (d) a plurality of band-shaped metal pattern units (b) arranged in the form of said geometrical pattern, and (e) a plurality of band-shaped metal pattern units (c) arranged in the form of said geometrical pattern, and the metal constituting the metallic pattern layer (A-1) is a metal selected from the group consisting of platinum, gold, silver, nickel, chromium, aluminum, copper, zinc, tungsten and iron.

6. The electromagnetic wave reflection-preventing material as claimed in claim 1, 2, 3, or 4, wherein at least one of the pattern layer (A) s in the multiple laminate unit structure is a coating pattern layer (A-2) having a volume resistivity of $10^{-3}$ to $10^3$ Ω . cm and a dry film thickness of 10 to 500 μm, and the pattern layer (A) other than the coating pattern layer (A-2) in the multiple laminate unit structure is a metallic pattern layer (A-3) which has a dry film thickness of 0.5 to 50 μm and has been prepared in the form of a first geometrical pattern, said first geometrical pattern being selected from the group consisting of (a) a plurality of plate-shaped metal figure units arranged in the form of said geometrical pattern, (b) a band-shaped metal pattern unit having a multi-figured structure, (c) a band-shaped metal pattern unit having a spiral shape, (d) a plurality of band-shaped metal pattern units (b) arranged in the form of said geometrical pattern, and (e) a plurality of band-shaped metal pattern units (c) arranged in the form of said geometrical pattern, said coating pattern layer (A-2) having been formed by coating a coating composition containing 50 to 500 parts by weight of a metal powder per 100 parts by weight of the solid content of a film-forming resin in the form of a second geometrical pattern, said second geometrical pattern being selected from the group consisting of (f) a plurality of plate-shaped figure units arranged in the form of said geometrical pattern, (g) a band-shaped pattern unit having a multi-figured structure, (h) a band-shaped metal pattern unit having a spiral shape, (i) a plurality of band-shaped metal pattern units (g) arranged in the form of said geometrical pattern, and (j) a plurality of the band-shaped pattern units (h) arranged in the form of said geometrical pattern, the metal constituting the metallic pattern layer (A-3) is a metal selected from the group consisting of platinum, gold, silver, nickel, chromium, aluminum, copper, zinc, tungsten and iron, the metal powder of the coating pattern layer (A-2) is a metal powder selected from the group consisting of platinum, gold, silver, nickel, chromium, aluminum, copper, zinc, tungsten and iron.

7. The electromagnetic wave reflection-preventing material as claimed in claim 1, 2, 3 or 4, wherein area ratio of void area to geometrical pattern forming substance area in the pattern of the pattern layer (A) is 0.1 to 10.

8. The electromagnetic wave reflection-preventing material as claimed in claim 2 or 4, wherein the resin layer (C) is a pattern resin layer having a void of 25 to 70 percent by volume, and said pattern resin layer (C) has been formed by coating a coating composition prepared by dispersing powder which is at least one member selected from the group consisting of ferrite powder, carbon powder, metal powder and electrically conductive metallic oxides powder consisting of tin oxide and indium oxide, or a mixture of the selected powder and a good dielectric material selected from the group consisting of titanate compound, silicon carbide and silicon nitride, into said resin, onto paper, cloth, nonwoven fabric or porous sheet, followed by molding under pressure, and by punching; or has been formed by coating the coating composition in the form of a pattern thereonto, followed by molding under pressure.

9. The electromagnetic wave reflection-preventing material as claimed in claim 8 wherein the void of the pattern resin layer (C) is filled with a a filling material which contains resin free from any components selected from the group consisting of (i) ferrite powder, (ii) carbon powder, (iii) metal powder, (iv) electrically conductive metallic oxides powder consisting of tin oxide and indium oxide, and (v) good dielectric material selected from the group consisting of titanate compound, silicon carbide and silicon nitride.

10. The electromagnetic wave reflection-preventing material as claimed in claim 1, 2, 3 or 4, wherein said layer (C) contains powder of at least one member selected from a group consisting of ferrite powder, carbon powder, metal powder and electrically conductive metallic oxides powder consisting of tin oxide and indium oxide, or a mixture of the selected powder and a good dielectric material selected from the group consisting of titanate compound, silicon carbide and silicon nitride, into said resin.

11. The electromagentic wave reflection-preventing material as claimed in claim 1, 2, 3 or 4, wherein said resin layer (C) optionally contains a metal powder in an amount up to 20 parts by weight per 100 parts by weight of the resin.

12. The electromagnetic wave reflection-preventing material as claimed in claim 2 or 4, wherein the resin layer (C) is formed by coating a coating composition prepared by dispersing a powder of at least one member selected from ferrite powder, carbon powder, metal powder and electrically conductive metallic oxides powder consisting of tin oxide and indium oxide, or a mixture of the selected powder and a good dielectric material selected from the group consisting of titanate compound, silicon carbide and silicon nitride, onto a substrate selected from the group consisting of a paper, cloth, nonwoven fabric and porous sheet, followed by molding under pressure.

13. The electromagnetic wave reflection-preventing material as claimed in claim 1, 2, 3 or 4, wherein a clear or colored coating layer is further formed onto the uppermost pattern layer (A) of the electromagnetic wave reflection-preventing material.

* * * * *